United States Patent [19]

Spear

[11] 4,400,577
[45] Aug. 23, 1983

[54] THIN SOLAR CELLS

[76] Inventor: Reginald G. Spear, 1434 Park Pl., San Marino, Calif. 91108

[21] Appl. No.: 284,084

[22] Filed: Jul. 16, 1981

[51] Int. Cl.³ .......................................... H01L 31/06
[52] U.S. Cl. ................................... 136/259; 29/572; 136/244; 136/255; 136/256; 136/258; 136/261; 136/251; 357/30
[58] Field of Search .............. 136/244, 251, 255, 256, 136/258 AM, 260, 261, 259; 357/30

[56] References Cited

U.S. PATENT DOCUMENTS 4,036,645  7/1977  Pinder et al. ......................... 136/260
4,281,208  7/1981  Kuwano et al. ...................... 136/249

FOREIGN PATENT DOCUMENTS 55-117287  9/1980  Japan .................................. 136/260

*Primary Examiner*—Aaron Weisstuch
*Attorney, Agent, or Firm*—Christie, Parker & Hale

[57] ABSTRACT

Solar cells and arrays of solar cells are made as thin films on insulating substrates. In an exemplary embodiment, a thin conductive film is deposited on glass and a semi-conductor film is deposited over the metal. The semi-conductor film has a P-N junction parallel to the substrate. Another conductive film is deposited over the semi-conductor and is insulated from the first conductive film. Contacts made to edges of the conductive films form solar cells. In an array of such cells the edge of the second conductive film of one cell can overlap the edge of the first conductive film of an adjacent film for connecting the cells in series. In one aspect of the invention the films are thin enough to be transparent. In another aspect, a plurality of semi-transparent films are stacked to absorb selective portions of the spectrum. In another aspect, a technique of stacking thin films using diagonal displacement of a mask provides successive layers with exposed and covered edges for suitable electrical connections.

7 Claims, 14 Drawing Figures

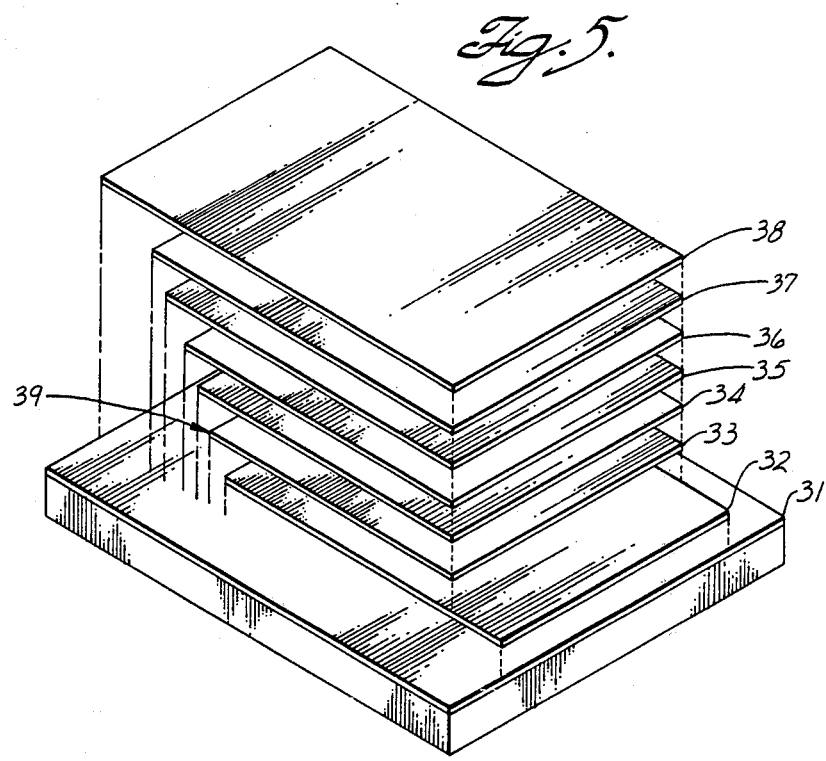
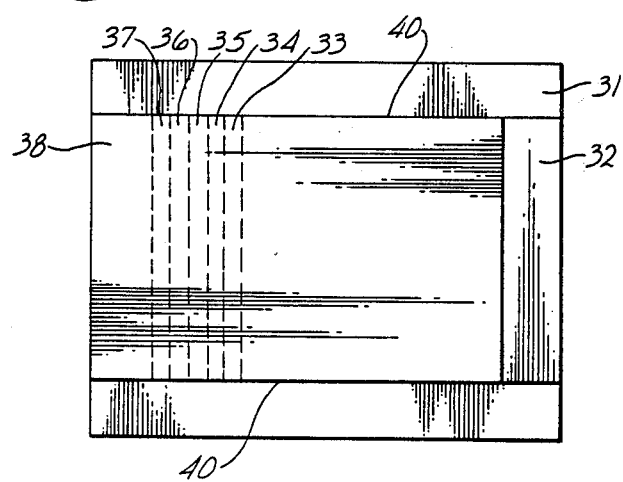

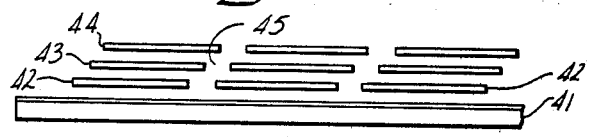
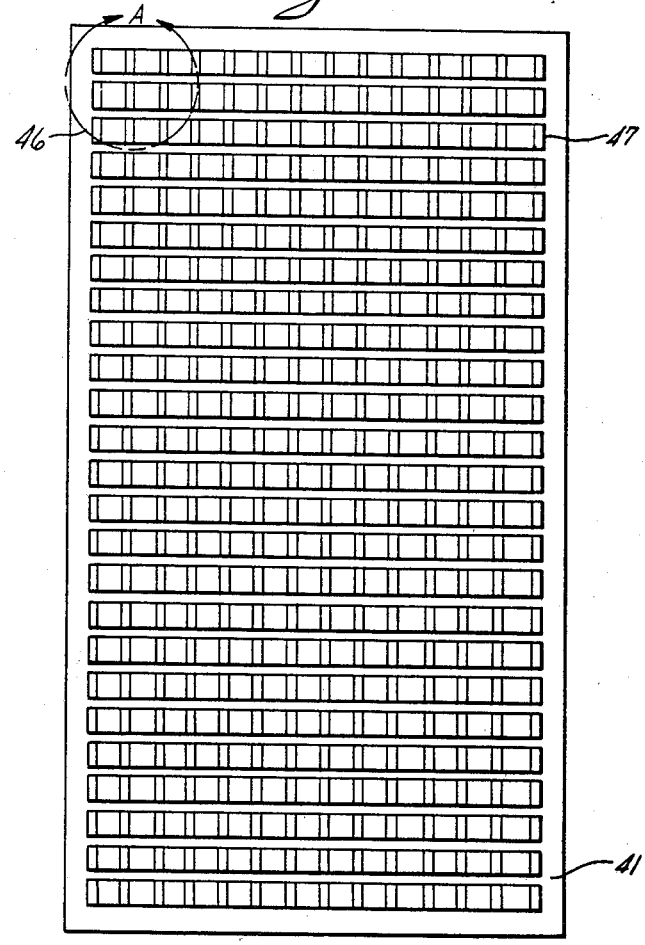
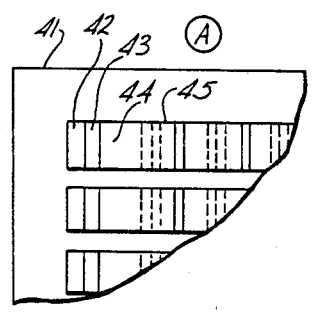

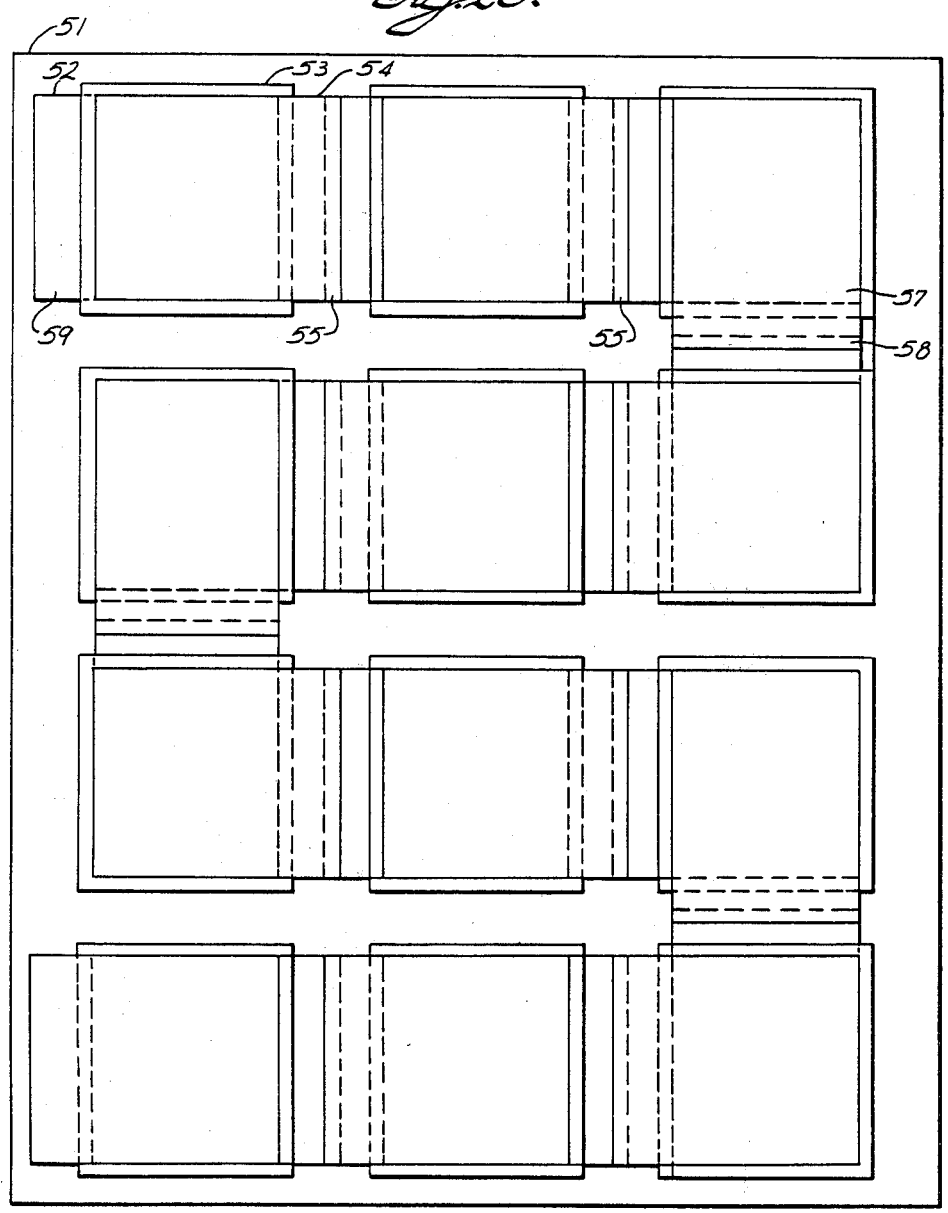

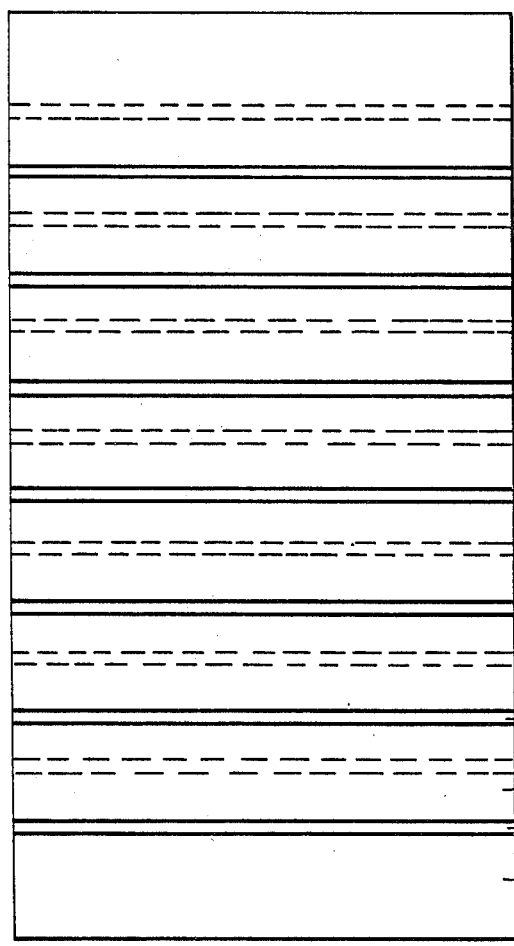 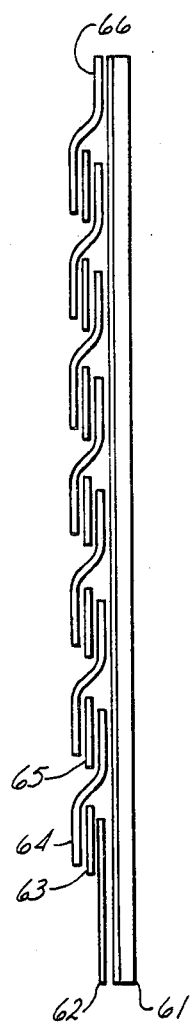

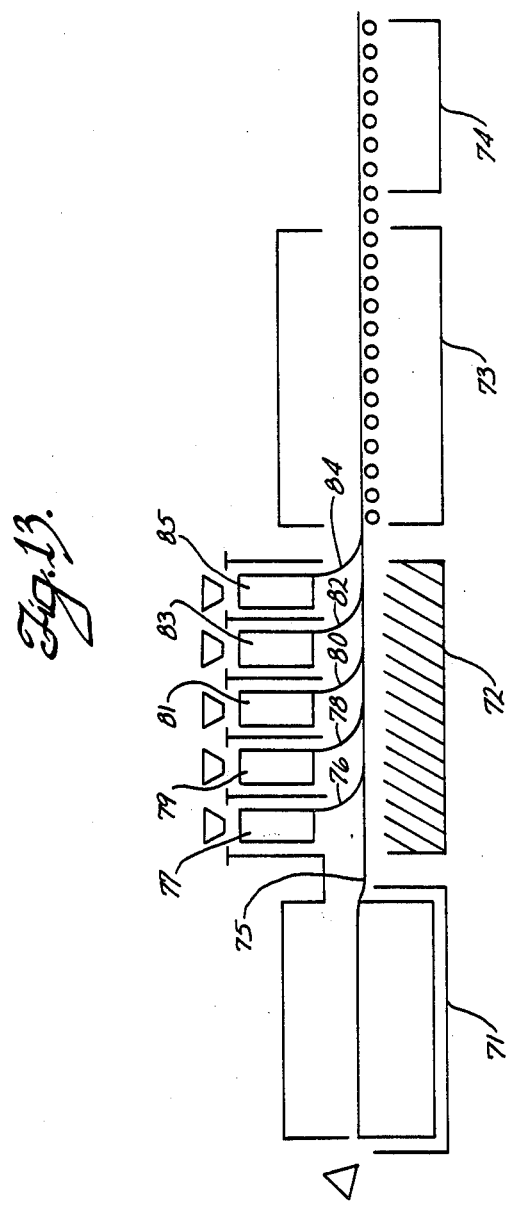

THIN SOLAR CELLS

BACKGROUND

Tinted glass plates in architectural structures have become a significant feature of contemporary design. These tinted glass plates are used extensively in the construction of office buildings, schools, hospitals, factories and other structures to reduce glare and provide heat absorption and lower the operating costs for air conditioning. In many instances passive plate glass surfaces encompass entire buildings and consequently could be a significant source of electrical energy, if provided with a photovoltaic capability. Preliminary calculations indicate that even with low efficiency photovoltaic responses, sufficient current could be generated to offset a portion, if not all, of electric power requirements for the enclosed structure.

Present commercial solar cells are significantly limited by voltage and efficiency and in experimenting with thin films on glass substrates, an additional goal was established to increase the voltage and efficiency of a photovoltaic cell by combining the appropriate properties of existing materials into a laminated or compound structure.

Regardless of the method of construction, in the end each completed cell must be rearranged in groups or "arrays", and this requirement dictates the final objective of this study which was to devise a means by which these complete arrays consisting of sheets of multiples of identical cells, can be printed or generated simultaneously together with the necessary circuitry, the complete sheet fully equipped and ready for installation.

BRIEF SUMMARY OF THE INVENTION

Solar cells and arrays of solar cells are made as thin films on insulating substrates. In an exemplary embodiment, a thin conductive film is deposited on glass and a semiconductor film is deposited over the metal. The semiconductor film has a P-N junction parallel to the substrate and can extend beyond at least some of the edge of the conductive film for insulation. Another conductive film is deposited over the semiconductor and is insulated from the first conductive film. Contacts made to edges of the conductive films form solar or photoemissive cells. In an array of such cells, the edge of the second conductive film of one cell can overlap the edge of the first conductive film of an adjacent film for connecting the cells in series. In one aspect of the invention, the films are thin enough to be transparent. In another aspect, a plurality of semi-transparent films are stacked to absorb selective portions of the spectrum. In another aspect, a technique of stacking thin films using diagonal displacement of a mask provides successive layers with exposed and covered edges for suitable electrical connections.

BRIEF DESCRIPTION OF THE DRAWINGS

FIG. 5 is an exploded perspective view of a third embodiment of solar cell;

FIG. 6 is a plan view of the solar cell of FIG. 5;

FIG. 7 is an exploded transverse cross-section of a multiple cell array of solar cells;

FIG. 8 is a plan view of the multiple cell array of solar cells;

FIG. 9 is a fragmentary enlargement of a part of the array of FIG. 8;

FIG. 10 is a plan view of another array of solar cells;

FIG. 11 is an exploded transverse cross-section of the third array of solar cells;

FIG. 12 is a plan view of the array of FIG. 11;

FIG. 13 is a schematic view of a float glass facility with means for mass producing solar cells.

DESCRIPTION

Since the principal objective of this research program was to develop photovoltaic plate glass, the efforts to maintain the transparency of the end product was a primary consideration. In using the application of thin films to passivated glass substrates, a significant effort was made to reduce or restrict the total thickness of the applied films to 5000 Angstroms or less, which in effect would restrict the transparency of the end product to about fifty percent. The transparency of a series of films became additionally significant later in the project when a series of semi-transparent film combinations or layers were stacked, one upon the other, so that each photovoltaic layer would absorb a particular portion of the remaining spectrum to which it was exposed, extracting in total all of the available light incident to the cell.

In so restricting this P-N junction and the electrically conductive layers, a remarkable discovery was made. In effect, it has now been proven that the photovoltaic activity or propagation of electrical current across the depletion zone and within the P-N homojunction actually occurs at a thickness of less than a micron, and depending on the concentration of dopants in all probability the thickness of this zone can be less than 2000 Angstroms. In addition to the experiments with ultra-thin semmi-transparent photovoltaic materials, a significant effort was made to select a highly conductive but normally transparent material and enhanced indium tin oxides proved to be satisfactory.

Figure 1:
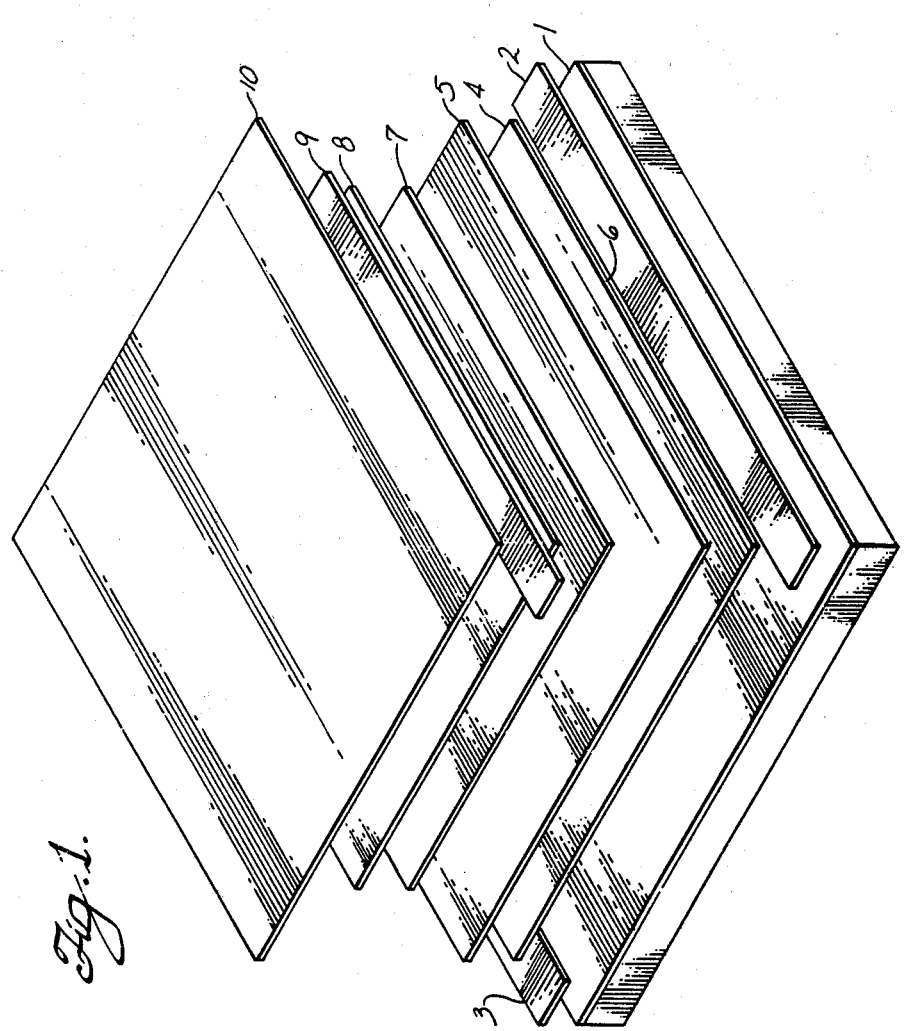
FIG. 1 is an exploded perspective view of many of the layers in a solar cell.
Figure 2:
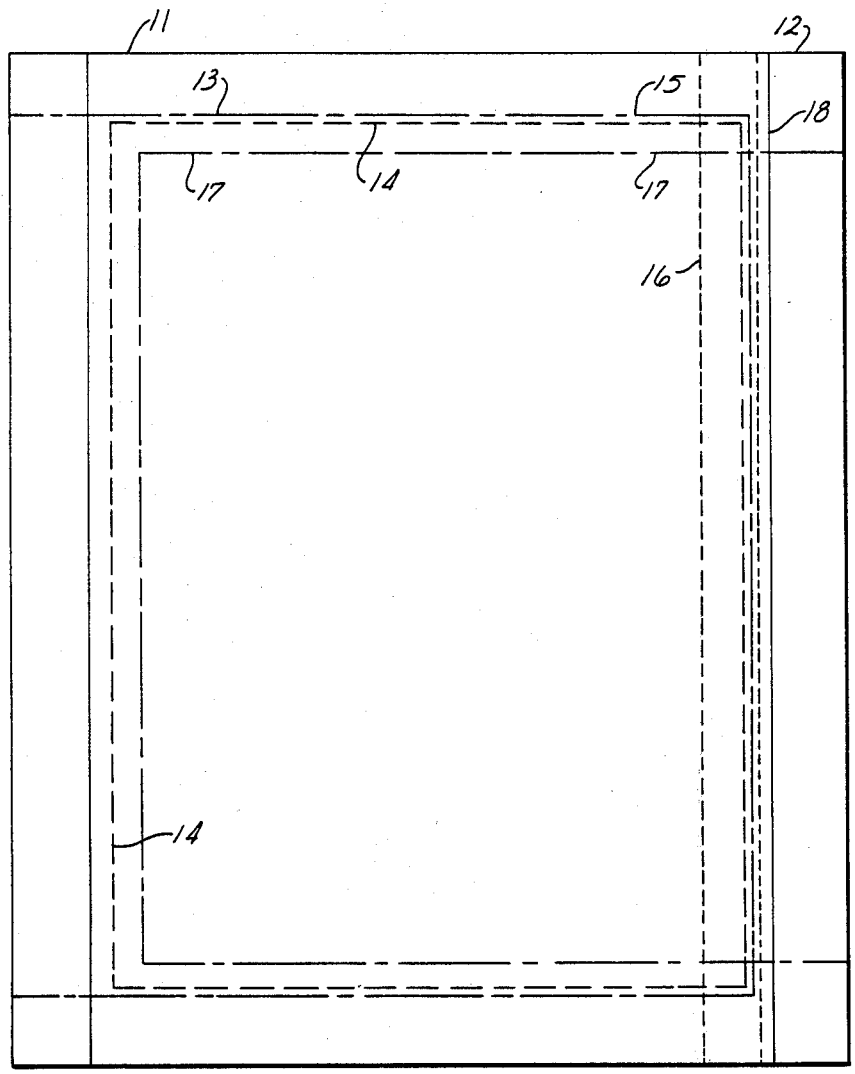
FIG. 2 is a plan view of the solar cell of FIG. 1.

The expanded drawing in FIG. 1 illustrates the structure of one of the first embodiments of the family of prototypes of large surface semi transparent photovoltaic devices fabricated to test the principles and experimental production techniques for large surface cells. A commercial glass plate, passivated principally with aluminum oxide, forms the base or substrate of a structure consisting of a series of planes or layers comprised of one or more vacuum deposited thin films. FIG. 2 is a plan view of the same embodiment demonstrating the outlines and geometric patterns of the various layers of thin films applied to a glass substrate.

These planes are deposited upon the glass substrate in such a manner as to conform to prescribed geometric patterns. The geometric pattern for each of the planes is dictated by the function of the film or films within the plane, and the changes in patterns serve to isolate or insulate the various deposited active layers which, in total, comprise a photovoltaic cell.

The geometric patterns are laid out in masks and placed over the glass substrate so that each of the planes or layers is deposited through its respective mask. As each successive plane of films is applied, the masking is changed to outline the next required pattern.

In the first plane a pair of heavy aluminum bus bars 2 and 3 are deposited upon the 8-inch by 10-inch passivated glass substrate 1. The bus bars 2 and 3 serve as the electrical terminals for the completed cell and the thickness is determined by the estimated amperage to be generated at the peak load of the cell. For example, in the case of the cell depicted in FIGS. 1 and 2, approximately five microns of aluminum was used.

The geometric outline and location of the bus bars 2 and 3 in FIG. 1 can also be seen at 12 and 11 respectively in the plan view of FIG. 2.

Having established the aluminum bus bars 2 and 3, a conductor layer is deposited which contacts bus bar 2 at 6. This conductor layer is comprised of an aluminum film 4 of a thickness of approximately 50 angstroms, which serves as a bond between the passivated glass substrate 1 and an overlying gold film 5. This gold film is approximately one to two hundred Angstroms thick, with a resistivity of about five ohms per square centimeter and sufficient residual transparency to pass the remaining light.

At this point in the fabrication of the cell, with the bus bars deposited and the conductive layer superimposed, the entire plate is removed and a new mask affixed for the next series of new layers.

Referring again to FIG. 2, the bus bars are seen at 11 and 12 and the aluminum-gold layer composed of films 4 and 5 is outlined with the dash-dot border at 13.

The next series of films in FIG. 1 are comprised of pre-doped amorphous-silicon wherein film 7 is phosphorous doped a-silicon sublayer of approximately 3,000 angstroms, and film 8 is a boron doped a-silicon overlay of approximately 500 Angstroms.

The outline of this layer can be seen in the plan view of FIG. 2 as the dash outline at 14, which is deposited within the confines of the subordinate aluminum-gold conductive layer at 13.

The margin 15 is provided in an effort to avoid exposing the aluminum-gold layer to possible direct contact and shorting from the superimposed or outer conductor.

As a further protection against shorting along the edges of the subordinate aluminum-gold layers and a-silicon, an insulator strip of aluminum oxide is deposited at 9 in FIG. 1 and outlined with short dashes at 16 in FIG. 2. This insulator strip 9 is about 5 microns in thickness which was considered heavy enough to prevent contact between the lower and upper conductive layers.

Having insulated the right hand margin of layers 4, 5, 7 and 8 in FIG. 1, an outer or top conductor layer of a single gold film of approximately 100 Angstroms was deposited within the margins of all of the previous layers, as shown at 17 in FIG. 2, and fully extending to contact the cover of the second bus bars 12 at 18 as shown in FIG. 2.

Again, the plate was removed from the chamber and remasked with the appropriate geometric pattern prior to the application of each new layer.

At this point, the entire stack of layers comprising the cell is complete. Because of the extreme sensitivity of these layers to atmospheric water vapor and dust, a protective layer of aluminum oxide 10 (FIG. 1) is placed over the entire cell, with the exception of the bus bars which must remain exposed for contact. As a suggested further protection, a layer of polyvinyl butyral, together with a second glass protective sheet, can be bonded over the aluminum oxide coating.

MATERIALS AND PROCESSES

Because of its excellent surface and other properties, glass offers the best medium for thin film application. It is an insulator, is corrosion and weather resistant, and its limited coefficient of expansion reduces the risk of fracturing the materials which are bonded to the surface, and when heated, the melting point of glass closely matches the melting points of the other active materials which comprise a solar cell.

In the applications which are discussed in this paper, it is essential to precondition the glass with an aluminum oxide which passivates the glass and prevents sodium ions from migrating and contaminating the adjacent photovoltaic layers.

It should also be noted, however, that in addition to glass substrates film can be deposited on other materials such as polished metal or fiberglass. There are also several types of cells produced from cadmium sulfide which are applied to copper. In the particular case of sputtering, success has been reported in the deposit of thin films on polished steel. Although the concepts which are discussed in this paper are specifically directed to use on glass, these other substrates can also be considered as a useful specific for certain forms of cells.

In the experiments which have been performed to date, several conductors and combinations of conductors suitable for thin film deposition have been tried which are, for the most part, common to the semi-conductor and solar cell industry in an effort to select a suitable material which would have transparent characteristics and retain highly conductive properties. The materials which were used in these experiments were basically aluminum, gold, and indium-tin oxide (ITO). Aluminum is highly conductive and lends itself readily to vacuum application. It has, however, the disadvantage of acting as a dopant for the silicon. Further, aluminum creates an undesirable discoloration when applied to glass in thicknesses greater than a few Angstroms. The advantage of aluminum is the use as a bonding agent between the glass substrate and other conductors such as gold. Aluminum also acts as an excellent reflector and was suggested as a reflector for residual light within the Composite Cell which is discussed elsewhere in this paper.

Gold is the best high grade conductor. In thicknesses of 50 to 200 Angstroms, gold is acceptably transparent which satisfied the primary criteria for this family of cells. However, in addition to its high cost, gold has another significant disadvantage. Unfortunately, it can also be absorbed by the silicon which creates an alloy commonly known as the "purple plague". This promotes "recombination", a condition which cannot be tolerated in solar cell construction. Studies with the electron microscope have shown that, in combination with other materials such as aluminum, gold will spread to an extremely thin, homogeneous, highly conductive film and therefore it has utility as a primary conductor in these prototypes. However, when applied to glass substrates without a bonding agent, such as aluminum, gold tends to bead, producing "islands" on the substrate as opposed to a closed network.

ITO has excellent features for transmitting light and, for purposes of these test cells, has proven to be extremely valuable. Its internal resistance, however, is far greater than the metals, but its transparent properties and electrical properties, when enhanced with a metallic interlayer (gold), are suitable for these experiments. Apparently ITO will not mate with the silicon.

In examining the properties of the various photovoltaic materials which are readily available today, and further, from exploring literature on the subject, it is clear that silicon, because of the suitability of most of its properties, was the best candidate as a photovoltaic material for experimental use. Efficiencies of 12 percent have been reported with crystalline silicon which is currently recognized as satisfactory. Other materials, such as gallium arsenide, cadmium sulfide, the tellurides, and a range of other glass-like amorphous materials, chalcopyrites, are very promising but for the moment present some serious technical and economic problems when considered for large scale use. The arsenides, and to some extent, the cadmium salts are poisonous.

Amorphous silicon created by decomposition of silane gas in an ion chamber is the most promising material.

Although vacuum equipment exists today by which large sheets of window glass can be tinted for use in architectural construction, a process which is primarily electron gun vacuum deposition may not be suitable for the production of silicon vacuum deposited cells since the silicon when deposited tends to become microcrystalline when applied to a heated substrate. It is known that the presence of hydrogen can influence this result by forming amorphous a-silicon. The presence of that hydrogen would bond the silicon and thus convert it into an amorphous state at the proper temperature.

Sputtering systems, which are also described here impose cell size limitations, since the targets and magnets involved are relatively small that only small-sized individual cells can be produced. But this process does have a utility as a means of making excellent laboratory samples and in particular the compound cells to which a portion of this work is directed.

Figure 3:
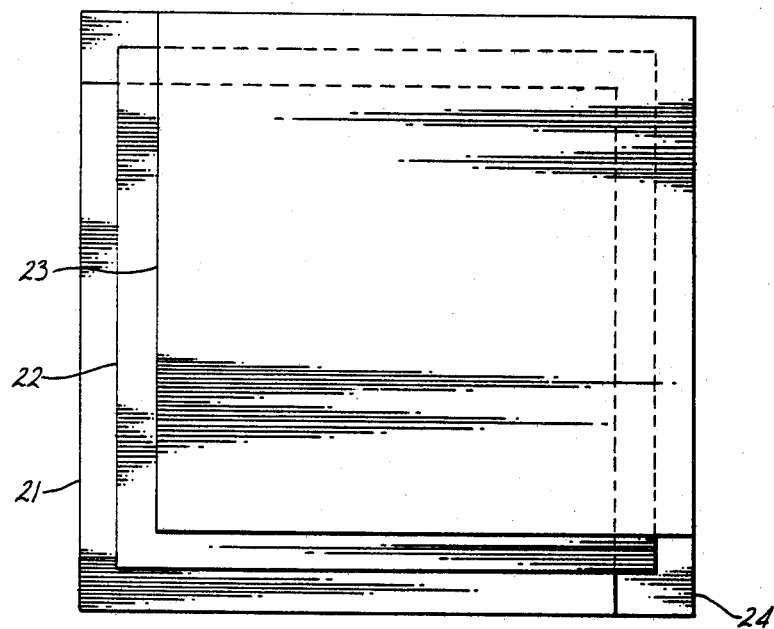
FIG. 3 is a plan view of a second embodiment of solar cell.
Figure 4:
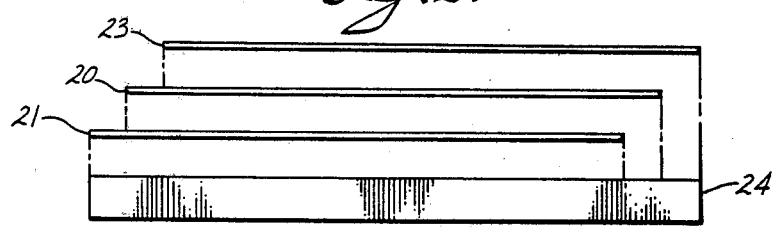
FIG. 4 is an exploded transverse cross-section of the second embodiment of solar cell.

Here again, the cell is comprised of planes or layers containing one or more films of selected materials. Referring to FIGS. 3 and 4 these planes are seen as the base conductive layer 21, and photoactive layer 22 and a second outer conductive layer 23, all on a glass substrate 24.

This embodiment was prepared in an ion-plasma vacuum chamber by the process which is commonly called sputtering.

The confines of the sputtering chamber restricted the size of the cell to a 4-inch square glass plate. This was exposed through a single 3½ inch by 3½ inch aperture in a mask which was repeatedly used to outline each of the successive layers by simply shifting the glass plate diagonally to three equally spaced index positions engraved in the mask adjacent to the aperture. This shifting can be accomplished externally by simple mechanical means, and therefore the substrate does have to be repeatedly removed from the chamber.

As before, the glass substrate 24 was commercially passivated, primarily with aluminum oxide, to eliminate degradation of the a-silicon layers by the migration of the sodium atoms from within the glass.

It is then placed within the sputtering chamber and raised to a temperature of 500 K. To the passivated substrate, a first layer 21 of discreet films of ITO and gold is applied, within the outline of the first masking position as shown in FIG. 3. The gold was used in minute quantities to enhance the conductive properties of the ITO. To prevent "re-combination" the a-silicon was isolated from the gold by the ITO film.

In this case a combination of ITO and gold was selected to reduce the resistivity of the conductive layers substantially below the internal resistance of the a-silicon layers.

The substrate is then shifted to a second position to apply though the same aperture in the mask a plurality of doped a-silicon layers at 22, constituting a P-N junction. Extreme care is taken during the shifting not to scratch or disturb the surface of the cell.

Boron and phosphorus doped layers of a-silicon can now be applied by either the use of pre-doped a-silicon collars, which are referred to in the art as "targets", or by the deposition of silicon from a pure silicon target, which silicon can be doped when ionized by borane and phosphine, respectively. The phosphine and borane are introduced as gases to the argon supplemented vacuum atmosphere and are infused during ion deposition. The combined layers of doped a-silicon should be controlled to a total thickness of less than 2,500 Angstroms. The gold is approximately 50 Angstroms thick and the ITO as much as 2 microns.

An alternative means of glow discharge is accomplished through the use of silane gas in combination with borane and phosphine. Here the entire deposition process is carried out by decomposing these gases. The experimental results are technically excellent but at this point are not considered financially feasible for production.

Without opening the vacuum chamber, the substrate is shifted to the third index position, the chamber turret rotated, and a top conductive layer 3 of first ITO and second gold is deposited. As in the previous cells, the top and bottom conductive layers of ITO and gold are separated and partially insulated by properly positioning the geometry of the photoemissive layer of doped a-silicon.

The resulting cell bears the characteristics which are necessary to be adaptable to limited manufacture for test purposes. This cell is far superior to its predecessors and is readily adaptable to limited laboratory manufacture.

In preparing the previous prototypes which are comprised of three or more layers of photoemissive and conductive material, a unique embodiment evolved by which higher efficiencies and higher voltages can be achieved. This cell is best produced for test purposes by means of sputtering, but it is believed, and again an objective, to also produce the cell by applying the required layers to a fused glass substrate at the time the glass is being drawn.

The following description, therefore, is presented with both construction methods in mind, but will be specifically directed toward producing a prototype by use of sputtering.

To a 4-inch by 4-inch passivated glass substrate 31, as shown in FIG. 5, the base conductive layer 2 is deposited. This layer 32 is comprised of a three to five micron film of aluminum, over which is applied a 500 Angstrom film of ITO, the combination of which is to act as a conductor and reflector. The ITO is added as a protection for the doped a-silicon layers which follow, since, under the influence of heat, aluminum will migrate and dope the a-silicon. The purpose of the reflector, in this configuration, is to utilize all of the available light energy from the visible spectrum by reflecting any residual photons back into a stack of layers of photoactive and conductive materials to be deposited above. Therefore, as shown in FIG. 5, at a temperature of approximately 300 K., to the previously applied aluminum-ITO layer 32, a first pair of alternately doped P-N a-silicon films which comprise layer 33 are deposited through the aperture by which layer 31 was outlined but after the substrate is shifted to achieve partial insulation aong edge 39 as was the procedure in previous descriptions. This P-N junction 33 is approximately 2,000 Angstroms in total thickness, and, therefore, absorbs that portion of the visible spectrum which has penetrated to this layer, it being understood that layer 33 is the bottom P-N junction in a state of three congruent P-N junctions.

Accordingly, directly above and adjacent, is a second ITO and gold conductive interlayer 34 totalling approximately 200 Angstroms, to which a second 2,000 Angstroms thick P-N doped a-silicon layer 35 is deposited, as before. At 36 a second 200 Angstrom ITO and gold conductive interlayer is deposited, followed by a third 2,000 Angstrom P-N doped a-silicon layer at 37. This procedure could be continued to the point at which all of the spectrum was absorbed. Three superimposed photoconductive layers in series are considered sufficient.

To the last P-N juncture, a final layer of three microns of ITO with a fraction of gold is deposited at 38, as shown in FIG. 5. In all cases the gold was insulated from the a-silicon by ITO.

It must be noted here that these layers can be applied to the substrate in reverse order in such a manner as to create a back contact mirror with the reflected surface as the top or outside coat of the sandwich. This has certain advantages if a nonreflective glass surface is employed to help reduce the reflection and consequent loss of the sunlight. Furthermore, the prototype as depicted in FIG. 4 utilizes a variant of the masking technique, which has been discussed throughout this paper, but also requires finish etching to delineate the margins at 40.

Again referring to FIG. 5, the principle of stacking can provide greater efficiencies in individual solar cells. By utilizing the etching techniques which are, incidentally, common in the semi-conductor industry, together with appropriate masking, a variant of the series of clean-cut photovoltaic stacks such as shown in FIGS. 7 to 9 can be produced.

MULTIPLE CELL ARRAY

In the previous sections in which the "Preferred Embodiment" and the "Multilayered Composite Cell" were discussed, it was found that photovoltaic and conductive substances can be applied to a number of different substrate materials through a screen or mask which, when moved, would permit the deposition of a series of linked cells.

To understand this concept, please refer to FIG. 8, which depicts a sheet of material, again, preferably glass, on which a matrix of individual cells in the form of small, identical rectangles is shown. Accordingly, a passivated glass substrate 41 is covered by a single mask which contains a plurality of uniform rectangular openings. These rectangular openings permit the passage and subsequent deposition of materials which comprise a solar cell. The first layer of these materials, as in previous cells, would be enhanced ITO shown at 42. Having deposited the ITO, a mask or screen is moved to a second position, and successive layers of P and N doped silicon 13 are vaporized and deposited. Now the mask is moved to a third index position equal to the second under position and the outer layer of ITO 44 is applied. This outer layer ITO contacts the inner layer ITO at 45, and a chain of array of cells in series has been produced on a single sheet. By linking the contacts which lie along the margin at 46 to the contacts which lie along the margin at 47, voltages due to the serial connections of cells in each row and currents due to the parallel connections of several rows can be obtained. Alternatively, the rows can be connected at alternate ends to successive rows to make a long sinuous path of cells with higher voltage.

A significant feature of the array of linked solar cells lies in the fact that it can be produced by the shifting of a single mask or its substrate without necessitating the removal of the work in progress from the vacuum chamber and therefore eliminates the risk of contamination.

This technique is also proposed for use with a "silk screen" process wherein each layer is applied as a slurry and dried prior to the application of successive layers.

An example of a sinuous array of solar cells is illustrated in FIG. 10 which has twelve cells connected in series. The cells are deposited on a glass substrate 51 suitably coated to prevent contamination of overlying layers. Each cell has a first rectangular conductive film 52 deposited in a rectangular area on the substrate. Next, a rectangular semiconductor film 53 with a P-N junction parallel to the substrate is deposited over the first conductive film. One edge 59 of the conductive film extends beyond the semiconductor for making electrical contact. The other edges of the semiconductor film extend beyond the edges of the first conductive film, thereby providing electrical isolation of the edges of the conductive film. Next, a second rectangular conductive film 54 is deposited over the semiconductor. This second film is displaced laterally from the first conductive film and extends beyond an edge of the semi-conductor film so as to overlap the first conductive film of an adjacent solar cell as at 55. At least a portion of the edges of the semiconductor film extend beyond the edges of the second conductive film to assure electrical isolation. At the ends of the rows of cells, inter row connections are made with the rectangular conductive areas 57 turned 90° to overlap the cell at the end of the adjacent row as at 58.

Another variant of a serially connected multiple cell array is illustrated in FIG. 11 and 12. In this array, the substrate 61 is a passivated sheet of glass. A rectangular conductive layer 62 is deposited on the substrate along one edge. Overlying a portion of this layer 62 there is a semiconductor film 63 which extends beyond the edge of the first conductive layer 62. A second layer of conductive material 64 is deposited next, overlapping part of the semiconductor layer and extending beyond it onto the substrate. The portion of the second layer of conductive material on the substrate is analogous to the first layer, and another layer 65 of semiconductor is deposited thereon. Such layers are overlapped successively across the substrate like shingles to form an array of solar cells connected in series. Electrical connection to the array is made via the exposed edge of the first conductive layer 62 and an edge of the last conductive layer 66 at the opposite edge of the substrate. A similar array can be made with overlapping of layers, like illustrated in FIG. 7.

The application of the various photovoltaic compounds and conductive materials in a molten state or ionized by means of vacuum process which rely on the evaporation of targets of parent materials, and the knowledge that the most efficient silicon solar cells are made from molten silicon, clearly demonstrates that the utilization of heat in the manufacturing process of the solar cells is beneficial. Consequently, a means by which the materials can be applied to the glass substrate at the time the glass if first drawn from a molten liquid would represent a significant advance.

FIG. 13 is representative of a system by which each of the materials can be applied in a molten state to a plate glass substrate during the drawing.

The schematic drawing of FIG. 13 represents a typical Pilkington Bros. Ltd. float glass facility. A furnace at 71 is linked to a molten tin bath at 72, the glass is continuously withdrawn in a single ribbon through a heat treating lehr at 73 and to a cutting line at 74. Assuming that the molten glass is drawn at approximately 1,600° C., a temperature matching can be made with the ingredients for a continuously withdrawn solar cell array. The melting points or optimum deposition temperatures of aluminum oxide, indium tin oxide and silicon, for example, closely match that of the cooling molten glass, and a mean temperature should be achieved to accommodate, without the risk of evaporation, each of the mating materials. At this point, it is important to recognize that alternative methods such as the use of sprays, powders, or decomposition of gases to deposit active coatings onto the molten glass, can be considered. However, the process of this discussion is limited to the application of the active materials by successive thin molten films.

FIG. 13 depicts a variant of the Pilkington process in which these materials seen are to be applied sequentially as the glass passes over the molten tin bath. The molten plate glass substrate 75 is totally coated with a continuous sheet of aluminum oxide 76, which is withdrawn from container 77. When cooled, this will passivate the glass substrate. To the passivated base, ribbon stripes 78 of enhanced ITO are delivered through ports or slots from a separate container 79, and these strips extend along the entire length of the substrate and are separated from each other by a margin which is sufficient to prevent contact of a particular stripe with any adjacent stripe.

Over these ITO stripes 78 a continuous sheet of P-doped silicon 80 is applied from an individual container 81. The outer margins of sheet 81 are held within the border of the substrate 75. A second corresponding sheet of N-doped silicon is applied from another container 83. These two sheets, when fused together, are to form a P-N junction, but it would be noted that an alternative means of gas doping one of the sheets could be substituted. The step is followed by a second or top layer of ITO stripes 84 which are applied from a container 85 and are identical in dimension and position to the preceding ITO stripes 78. By this process a single array of multiple stripes with contacts above and below an inner layer of P-N doped silicon homojunction emerges from the heat treating lehr 73 and can be cut into single arrays at 74. For purposes of this discussion, 4-feet by 8-feet sheets are cut.

Following cutting, a margin of approximately one inch is etched along one of the eight-feet sides of the finished glass plate array. This etching is cut to a depth which is sufficient to remove the two top layers and the P-N doped silicon exposing the ends of the inner layer of ITO stripes as contacts.

By connecting the top ITO stripes and the exposed contacts of the inner ITO layers, combinations of currents and voltages can be selected. This embodiment, as well as any of the others hereinabove described, can be protected by covering the solar cells with a second layer of glass, or of plastic, by means of a conventional polyvinyl butyral interlayer laminated onto the glass substrate by techniques like those presently used to make safety glass.

MANUFACTURING LOW COST ARRAYS

A low cost solar array can be manufactured through the application of a plasma spray process which is becoming widely used in industry. The plasma process equipment is produced in this country by a number of companies, principally Union Carbide and Tafa, for the application of numerous metal coatings and ceramics to various industrial and aerospace products. The coats can be applied either by melting through induction, electric arc, or by RF generators. For use in this process, the RF application of conductive and photovoltaic materials in the presence of an oxygen-free atmosphere is the appropriate procedure.

Since plasma sprays can be effectively applied to a number of materials, the process should not be construed as limited solely to glass. There are many applications for solar cells in which metal substrates can be used as well as plastics and plastics in combination with metal, as "printed circuit boards," to which photovoltaic compounds could be applied. The preferred substrate is glass.

In the particular case of the use of plasma spray, selection of the mask is significantly important, since the mask may have to be disposable at the end of each operation. Two kinds of masks are therefore considered:

1. A semi-permanent metal, carbon, or plastic mask.
2. A completely disposable impregnated paper or plastic mask.

The suggestion for the disposable nature of the mask lies in the fact that, as these coats are applied, a buildup occurs along the aperture or periphery of the opening of each of the individual holes which, through repeated use, will distort or destroy the tolerance of the dimensions of each cell component. The so-called semi-permanent mask is also subject to a substantial buildup of material along the edges of the aperture through which material is being applied, and would therefore have to be cleaned or discarded after successive applications.

The second form of mask, the disposable variety, has the advantage of being clean for each application. The only conceivable disadvantage would be the necessity for an additional labor step. But in either case, the mask has to be affixed to the substrate for each operation. This attachment procedure could be automatic in both cases, but for the moment it is contemplated as a hand operation, even in limited production.

The semi-permanent masks can be made of materials such as metal or plastic impregnated with carbon or made of sheet graphite to which at least one of the components, silicon, will not adhere.

The disposable masks should be paper, in which the apertures are cut or punched out of a continuously flowing roll of paper, and individual sheets cut to the size of the substrate. If these paper masks are partially coated with pressure sensitive adhesive, they can be applied to the substrate at the top and rolled on with just sufficient spots or areas of adhesive to "tack" the mask down to the substrate. The difficult part of applying the disposable masks lies in handling the substrate, and extreme care will have to be taken with this operation to see that contamination or scratching does not occur during the time the mask is applied or removed.

Disposable masks have the advantage of offering a time to inspect the product between coats, which is a beneficial feature in any manufacturing process, since for each set of coats a new mask will be required, making three masks necessary for the construction of one array.

It must be noted here, during a description of the masking process, that the application of heat may be necessary as an integral step or after the masking and coat application sequence is completed. Heat treating is anticipated as a necessary component for the construction of the completed array. Therefore, the selection of this material for the mask is an important consideration, since the mask can become charred or distorted with excess heat.

A series of glass plates are prepared in advance of the construction procedure. These plates are cut to size, edges trimmed, and passivated principally with aluminum oxide prior to the application of the first of the set of three masks.

After cutting, cleaning, and passivating the glass substrate, a properly cleaned or new mask is fitted to the glass. This first mask is arranged to permit deposition of the first conductive material onto the glass substrate. It should be noted at this point that this first conductive material can either represent the top of the cell to be constructed or the base coat. In the particular case of this configuration, the first conductive material will constitute the top electrical component of the solar array and will lie directly adjacent and in contact with the aluminum oxide passivated surface of the glass plate. The conductive material, in this instance, is principally enhanced indium tin oxide (ITO). Under certain circumstances, this enhanced ITO will not be considered fully conductive, in which instance a conductive grid can be applied to the glass substrate prior to this step, and the ITO coating makes electrical contact with the grid.

Having affixed the mask to the substrate, the assembly is placed in a plasma chamber in which the inert atmosphere is continuously replaced to remain free of oxygen. Either nitrogen or argon is suitable as an inert atmosphere.

The ITO is fed as powder into the "gun", which heats the material substantially above its melting point and deposits the ITO as melted droplets on the substrate. It is assumed at this juncture that the substrate can remain cool, but it may be necessary to heat the substrate to approximately 300° C. in order to get a significant bond between the components of the structure. Again, it must be noted that in the event disposable masks are used, they will have to be constructed of a material which will withstand heat. For purposes of this explanation, it is assumed that the first coat of ITO is to be applied at ambient temperature.

Following the deposition of the first conductive coat, the assembly is removed from the chamber and the mask carefully removed and the treated substrate inspected. This entire procedure must be done in a clean room atmosphere, since, as in the case of vacuum deposition, dust will, to some degree destroy the quality of the end product.

Having removed the first mask, a second mask is affixed in preparation for the application of the photovoltaic coats.

Again, the assembly is introduced to the deposition chamber, and an RF plasma spray of pre-doped boron-silicon is applied. Here the silicon must be introduced to the RF "gun" in rod form. Normally, metals and ceramics deposited through plasma guns are fed as a powder into the melting zone, but there is a significant risk of contamination in attempting to pulverize silicon even in a non-oxidizing or nitrogen atmosphere. Fifty parts per million will oxidize silicon and render it useless. It is anticipated that the total thickness of the coat of silicon which will constitute a P-N structure will be on the order of five microns, and consequently the timing of the spraying is critical. During the spraying procedure, the pre-doped silicon is fused in an argon gas stream to which two additional gases, phsophine and hydrogen, are to be introduced. Approximately two percent of hydrogen is considered to be necessary, in order to provide a reducing atmosphere and further to enter into the crystalline structure of the cell to help satisfy any existing loose bonds.

In addition to supplying hydrogen, it is contemplated that at least one of the dopants be introduced to the plasma as a gas. Since the silicon rod was pre-doped with boron, phosphine will be injected during the increment of time required for the deposition of the first micron of silicon material. The balance of approximately four microns of boron doped silicon will be applied without the presence of the phosphine.

This spraying operation is continuous and the structure will be a gradient homojunction which in effect will create a N+, N, P, P+ junction.

One significant feature of plasma desposition lies in the fact that these melted, extremely hot, coats can be applied to cold substrates. Following the deposition of a P-N junction, as described above and the removal of the masks, an intermediate step of sintering can be included. This step consists of applying the direct heat from the silicon-free gas plasma to the entire substrate and deposited coats to just raise the temperature of the silicon structure to its melting point, and permit the formation of a multi-crystalline structure. Again, alternative procedure would be to elevate the temperature of the glass substrate to a point at which fracturing would not occur, and then apply the silicon layers. The ultimate objective of this step of applying the photovoltaic silicon coat is to uniformly crystallize the silicon homojunction.

Following the deposition of photovoltaic layers, the heat treating and removal of the second mask, the third mask is attached, the apertures of which will constitute the geometry of the final conductive layer. This layer can be make principally of aluminum, and simply applied by the RF plasma "gun" directly to the pre-deposited semiconductor layers.

The encapsulation should begin by applying a general coat of aluminum oxide over the entire completed array. Although this coat serves as an additional handling protection, it may not in the end be necessary, but has proved a useful precaution in the preparation of prototypes which led to the development of this configuration.

The final encapsulation follows the procedure for the manufacture of "safety glass."

The temperature of formation of the crystalline structure of silicon is critical, particularly of this hybrid means of creating crystalline wafers. The objective is to produce a single wafer of a minimum number of independent crystals. Wafers consisting of imperfections in the form of independent crystals are acceptable for solar cell construction. For example, the Tyco Ribbon Process produces a wafer which is not suitable for the semiconductor industry, but is of a satisfactory quality for solar cell use.

The silicon can be introduced to the plasma chamber as a powder, and extreme care must be taken to prevent this powder from oxidizing during the process steps. The silicon should be ground to the largest grain size compatible with the plasma spray system and then washed in a dilute solution of hydrogen fluoride. The solution of hydrogen fluoride will be gradually exchanged with distilled water and acetone to a point at which acetone has replaced the hydrogen fluoride solution. The silicon can then be dried in a chamber containing hydrogen and an inert gas. The prepared powder is then introduced to the ion plasma chamber through the appropriate hopper, thus assuring that the least possible exposure to latent oxygen has been assured.

In mass production it is also expected that both dopants can be introduced as gases, since both borane and phosphine do not react with argon and hydrogen in the plasma.

Figure 14:
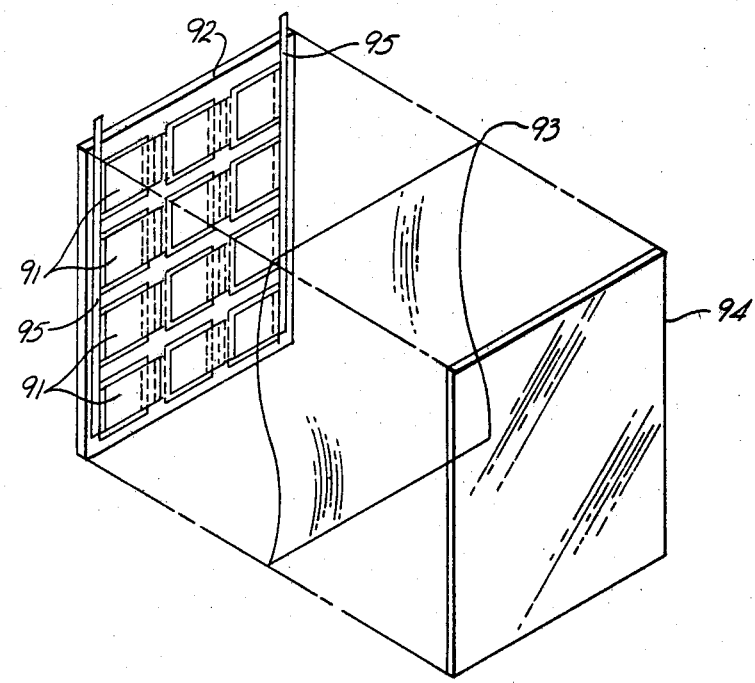
FIG. 14 is an exploded view of a laminated solar cell array.

FIG. 14 is an exploded view of an array of solar cells 91 on a glass substrate 92 protected with an overlying protective layer. The solar cells are initially protected with a layer of aluminum oxide, not shown. A conventional interlayer 93 of polyvinyl butyral, polyurethane, silicone or the like is laid over the array of cells and a layer 94 of glass, polycarbonate, acrylic or the like, is laid over the interlayer. The sandwich is then bonded with heat and pressure in a conventional manner. The sandwich also includes bus bar leads 95 along each edge making electrical contact with solar cells in each row. The leads 95 extend beyond the edge of the sandwich for connection to external circuits. These bus bars can, for example, be strips of metal foil held in place in contact with a conductive layer of the cells by pressure of the interlayer. Conductive adhesive can be included to enhance strength and contact if desired.

It can be desirable to avoid edge effects in the photoactive semiconductor layer where the N and P layers are indistinct. This can be provided by depositing one of the layers, for example, an N-doped layer of silicon. A narrow band of aluminum oxide or other electrical insulator is then deposited along an edge of the semiconductor overlapping the edge a couple millimeters or less. The other semiconductor layer, for example, P-doped silicon, is then deposited over the first with its edge overlapping the insulating layer. This keeps feathered edges of the silicon apart and minimizes edge effects.

It is often desirable to provide an array of a plurality of electrically connected solar cells instead of a few large area cells. The resistance of thin films is such that effective power generation can be minimal at substantial distances from low resistance electrical connections. For example, in a 4-foot by 8-foot window having a transparent (or semi-transparent) solar cell over the entire area, the center may be ineffective in generating useful power. Smaller windows or subdivision of the larger pane into a plurality of solar cells can increase the power.

This application is related to disclosure document Ser. No. 082,586 entitled "Photovoltaic Glass Plate" filed by me in the U.S. Patent and Trademark Office on July 16, 1979. The contents of that disclosure document are hereby incorporated by reference in this application.

In the event that aluminum is used as one of the conductive electrodes and deposited first upon the glass in the reverse sequence of the process just described, the temperature of the glass can only be elevated at 577° C., the critical point at which a eutectic would form. Again, experiments will have to be conducted to see at what substrate temperature and rate of formation this process can best be carried out.

What is claimed is:

1. A semi-transparent solar cell comprising:
   a passivated glass substrate;
   a first electrically conductive transparent film on the glass substrate;
   a photoactive semiconductor layer over the conductive film having a P-N junction parallel to the glass substrate and sufficiently thin to be substantially transparent;
   a second electrically conductive transparent film over the semiconductor layer and electrically isolated from the first conductive film;
   an electrically insulating transparent layer over the second conductive film;
   a first electrically conductive bus bar on the glass substrate along one edge of the semiconductor layer and connected to the first conductive film; and
   a second electrically conductive bus bar on the glass substrate along the opposite edge of the semiconductor layer and connected to the second conductive film.

2. A solar cell as recited in claim 1 wherein the insulating layer comprises a nonconductive metal oxide.

3. A solar cell as recited in claim 1 wherein the insulating layer comprises a layer of glass laminated to the glass substrate.

4. A solar cell as recited in claim 1 wherein the insulating layer comprises a layer of transparent plastic.

5. A solar cell as recited in claim 1 wherein the semiconductor layer comprises a layer of P-doped silicon and a layer of N-doped silicon.

6. A solar cell as recited in claim 1 wherein the conductive film include indium-tin oxide.

7. A solar cell as recited in claim 1 wherein the passivated glass substrate comprises a layer of aluminum oxide between the glass and the first electrically conductive transparent film.

* * * * *